(12) United States Patent
Park et al.

(10) Patent No.: US 8,107,271 B2
(45) Date of Patent: Jan. 31, 2012

(54) TERMINATION CIRCUITS AND SEMICONDUCTOR MEMORY DEVICES HAVING THE SAME

(75) Inventors: Kwang-Soo Park, Suwon-si (KR); Jae-Jun Lee, Seongnam-si (KR); Jong-Hoon Kim, Hwaseong-si (KR); Hoe-Ju Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1427 days.

(21) Appl. No.: 11/649,805

(22) Filed: Jan. 5, 2007

(65) Prior Publication Data
US 2007/0205848 A1 Sep. 6, 2007

(30) Foreign Application Priority Data
Feb. 20, 2006 (KR) .................. 10-2006-0016227

(51) Int. Cl.
*G11C 5/06* (2006.01)

(52) U.S. Cl. .................................. 365/63; 365/189.05

(58) Field of Classification Search .................. 365/63, 365/189.05
See application file for complete search history.

(56) References Cited

U.S. PATENT DOCUMENTS
7,161,378 B2 * 1/2007 Kang et al. .................. 326/30

FOREIGN PATENT DOCUMENTS
| JP | 10-126316 | 5/1998 |
| JP | 2002-141794 | 5/2002 |
| KR | 10-2005-0001167 | 1/2005 |

* cited by examiner

*Primary Examiner* — Michael Tran
(74) *Attorney, Agent, or Firm* — Harness, Dickey & Pierce, P.L.C.

(57) ABSTRACT

A termination circuit is connected to an input buffer receiving a data signal, and includes at least one termination resistor connected to the input buffer for impedance matching. At least one switch controls a connection between the input buffer and a corresponding one of the at least one termination resistors. A control signal generator generates a control signal for selectively enabling the termination circuit by controlling each of the at least one switches. The control signal has an input period less than or equal to an input period of a data signal.

22 Claims, 5 Drawing Sheets

TERMINATION CIRCUITS AND SEMICONDUCTOR MEMORY DEVICES HAVING THE SAME

PRIORITY STATEMENT

This non-provisional U.S. patent application claims priority under 35 U.S.C. §119 to Korean Patent Application No. 10-2006-0016227, filed on Feb. 20, 2006, in the Korean Intellectual Property Office (KIPO), the entire contents of which is incorporated herein by reference.

BACKGROUND

Description of the Related Art

Related art semiconductor memory devices, such as, dynamic random access memories (DRAM), may include an input/output buffer for sending/receiving data signals to/from an external controller. Related art DRAMs may further include a termination circuit connected to the input/output buffer for impedance matching because noise may occur when a data signal is sent or received. The noise may result from reflection caused by impedance mismatching.

FIG. 1 is a circuit diagram illustrating a related art termination circuit included in a related art semiconductor memory device. The termination circuit of FIG. 1 includes on-die termination and may be connected to an input buffer inside a semiconductor chip.

Referring to FIG. 1, a related art semiconductor memory device 10 may include an input buffer 11 for receiving a data signal through a pad PAD and transmitting the data signal to an internal circuit 13. A termination circuit 12 may be connected to the input buffer 11. The termination circuit 12 may reduce noise resulting from impedance mismatching when the data signal is received.

The termination circuit 12 may include at least one termination resistor connected to the input buffer 11. For example, the termination resistors may be, for example, a first resistor R1 and a second resistor R2. One end of the first resistor R1 is connected to a power voltage VDDQ and one end of the second resistor R2 is connected to a ground voltage VSSQ. The termination circuit 12 may further include a first switch SW1, which is connected between the other end of the first resistor R1 and the input buffer 11, and a second switch SW2, which is connected between the other end of the second resistor S2 and the input buffer 11. A termination enable signal TE may be transmitted to the gate of the second switch SW2 to control the second switch SW2. An inverse signal TEB of the termination enable signal TE may be transmitted to the gate of the first switch SW1 to control the first switch SW1.

When the first switch SW1 and the second switch SW2 turn on, and the termination circuit 12 is enabled, current flows from the power voltage VDDQ to the ground voltage VSSQ, which results in power consumption. The related art memory device does not include a switch element for enabling/disabling the termination circuit 12, resulting in higher power consumption due to the flowing current. Even it the switch element is included, whether in a read-mode or a write-mode, the current flows causing continuous power consumption.

SUMMARY

Example embodiments relate to termination circuits and semiconductor memory devices having the same. At least one example embodiment provides termination circuits capable of reducing power consumption by controlling a termination resistor to be periodically on/off and semiconductor devices having the same.

Example embodiments provide termination circuits capable of reducing power consumption, by periodically controlling enable/disable of the termination circuit when a data signal is input, and a semiconductor memory device having the same.

At least one example embodiment provides a termination circuit connected to an input buffer receiving a data signal. The termination circuit may comprise at least one termination resistor, at least one switch and a control signal generator. The at least one termination resistor may be connected to the input buffer for impedance matching. The at least one switch may control a connection between the one or more termination resistors and the input buffer. The control signal generator generating a control signal for controlling on/off of the one or more switches. The control signal generator may generate a control signal having a period equal or substantially equal to 1/n (n is integer) of the input period of the data signal, and may control the at least one switch such that the termination circuit is selectively enabled in parts of an input section of the data signal.

A section where the control signal enables the termination circuit may correspond to a section where a data signal level transition occurs, and the control signal may have a period equal or substantially equal to the input period of the data signal.

According to at least some example embodiments, a control signal generator may include a first delay unit and a logic operating unit. The first delay unit may receive a clock signal and outputs the clock signal with a delay. The logic operating unit may perform a logic operation between the clock signal and an output signal of the first delay unit, and may output a signal having a period equal or substantially equal to 1/n of the input period of the data signal. The control signal generator may further include a second delay unit. The second delay unit may receive a signal output from the logic operating unit, and output the signal with a delay to be used as the control signal.

An amount of delay of the first delay unit and/or the second delay unit may be controlled according to a test result of data signal input/output characteristics with respect to an external controller.

The first delay unit may output the clock signal with delaying the clock signal by a half input period of the data signal, and the logic operating unit may output a result of an exclusive-OR operation between the clock signal and an output signal of the first delay unit.

The control signal generator may include a frequency multiplier and a delay unit. The frequency multiplier may receive a clock signal and output a signal having a frequency n times the clock signal. The delay unit may receive a signal output from the frequency multiplier and output the signal with a delay.

According to another example embodiment, a semiconductor memory device may include a termination circuit connected to an input buffer receiving a data signal. The termination circuit may include at least one termination resistors, at least one switch and a control signal generator. The at least one termination resistor may be connected to the input buffer for impedance matching. The at least one switch may control a connection between the at least one termination resistor and the input buffer. The control signal generator may generate a control signal for controlling the at least one switch. The control signal may have a period equal or substantially equal to 1/n (n is integer) of the input period of the data signal such that the termination circuit may be selectively enabled in parts of an input section of the data signal.

According to another example embodiment, a termination circuit connected to an output buffer for outputting a data signal may include at least one termination resistor, at least one switch and a control signal generator. The at least one termination resistor may be connected to the output buffer for impedance matching, and the at least one switch may control a connection between the at least one termination resistor and the output buffer. The control signal generator may generate a control signal for controlling on/off of the one or more switches. The control signal generator outputs a control signal that enables the termination circuit according to a section where a level transition of the data signal occurs, and may control the at least one switch such that the termination circuit is selectively enabled in parts of an output section of the data signal.

BRIEF DESCRIPTION OF THE DRAWINGS

Example embodiments will become more apparent by describing in detail example embodiments shown in the attached drawings in which.

DETAILED DESCRIPTION OF EXAMPLE EMBODIMENTS

Figure 1:
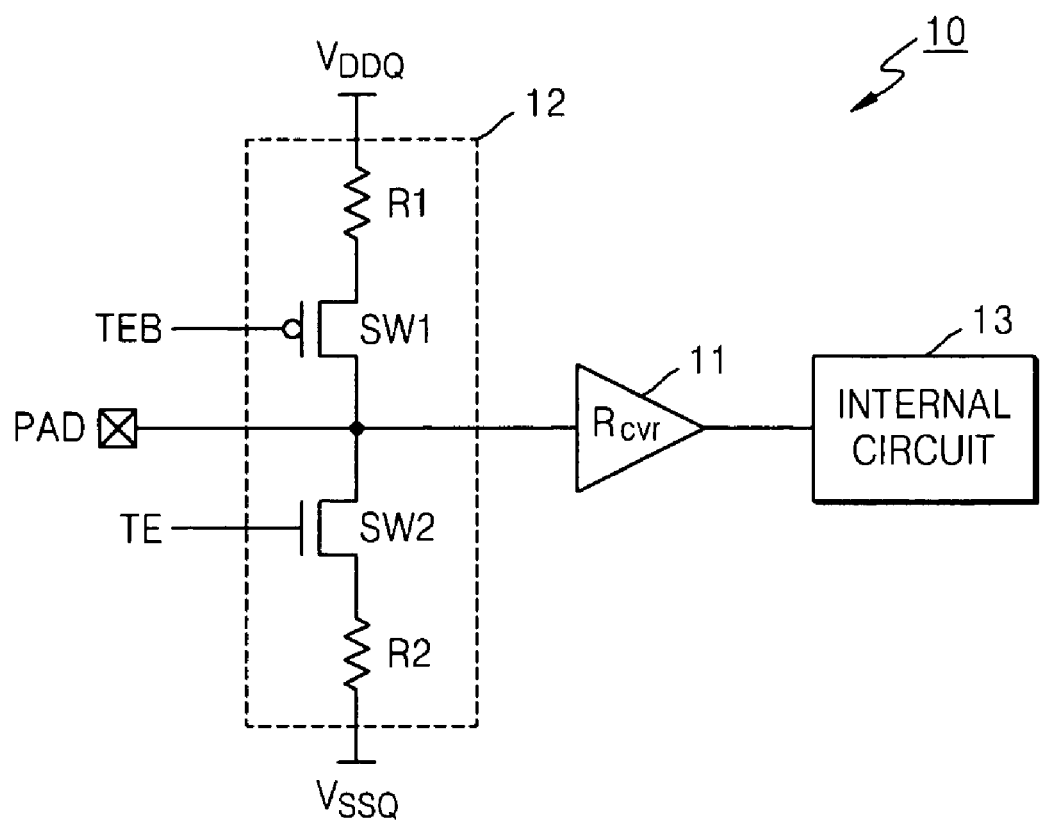
FIG. 1 is a circuit diagram illustrating a related art termination circuit.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
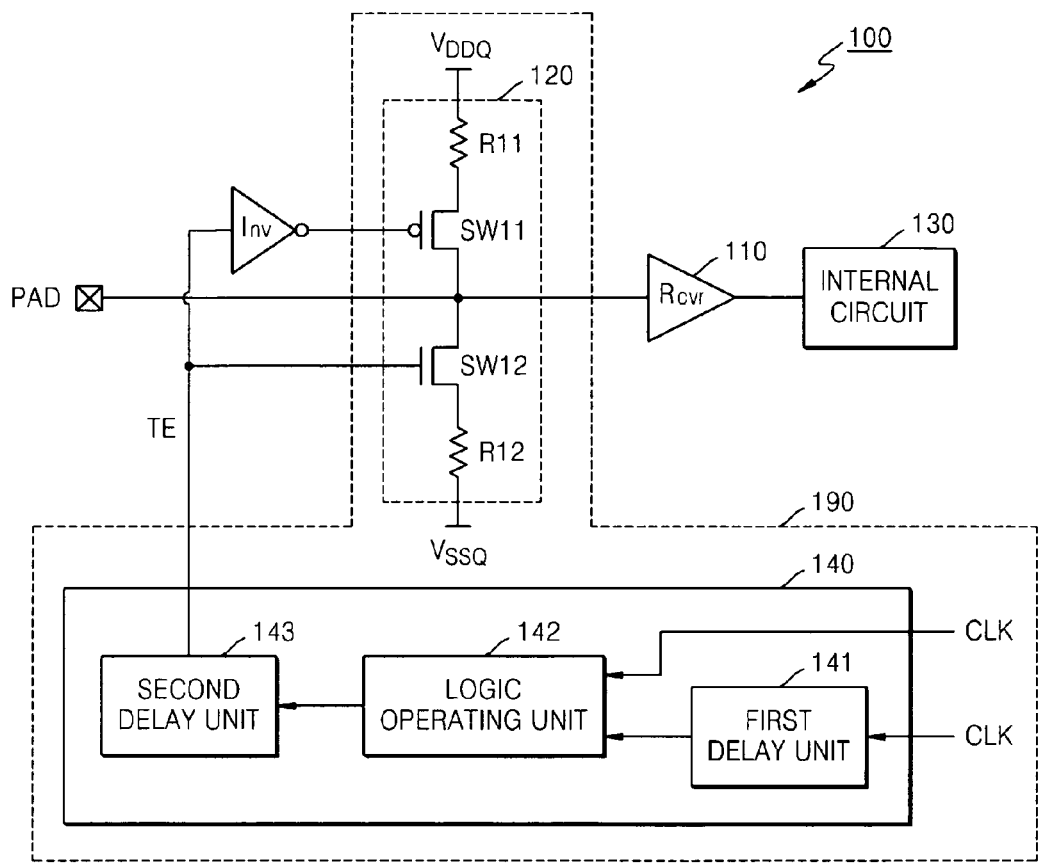
FIG. 2 is a circuit diagram illustrating a termination circuit included in a semiconductor memory device, according to an example embodiment.

FIG. 2 is a circuit diagram illustrating a semiconductor memory device, according to an example embodiment. Referring to FIG. 2, a semiconductor memory device 100 may include an input buffer 110, which receives a data signal through a pad PAD and transmits the data signal to an internal circuit 130. A termination circuit 190 may be connected to the input buffer 110 for reducing noise generated due to impedance mismatching when the data signal is received.

The termination circuit 190 may include an impedance matcher 120 for impedance matching (e.g., practical impedance matching) when the data signal is received and/or a control signal generator 140 for enabling and disabling of the impedance matcher 120.

The impedance matcher 120 may include at least one termination resistor (e.g., one or more or a plurality of termination resistors) electrically connected to the input buffer 110. In at least this example embodiment, the plurality of termination resistors may include a first resistor R11 and a second resistor R12. One end of the first resistor R11 may be connected to a power voltage VDDQ, and one end of the second resistor R12 may be connected to a ground voltage VSSQ. One or more switches also may be included to enable and disable the termination circuit by selectively connecting the first and second resistors R11 and R12 and the input buffer 110. For example, the plurality of switches may include a first switch SW11 and a second switch SW12. The first switch SW11 may be connected between the other end of the first resistor R11 and the input buffer 110 and the second switch SW12 may be connected between the other end of the second resistor S12 and the input buffer 110.

The termination circuit 190, according to at least this example embodiment, may further include a control signal generator 140. The control signal generator 140 may generate a control signal TE to control the first switch SW11 and the second switch SW12. When the data signal is input with a signal input period of T, the control signal generator 140 may generate the control signal TE having 1/n (where n is integer) of the signal input period of T. In response to the control signal TE, the first switch SW11 and the second switch SW12 may turn on or off.

When a data signal is input, a data signal level transition due to impedance mismatching may cause a reflection phenomenon. In this case, the control signal generator 140 may turn on the first switch SW11 and the second switch SW12 according to where the data signal level transition occurs.

The control signal generator 140 may include a first delay unit 141, a logic operating unit 142 and a second delay unit 143. The first delay unit 141 may receive a clock signal CLK and output a delayed clock signal. The logic operating unit 142 may output a result of a logic operation between the clock signal CLK and a signal output from the first delay unit 141. An output signal of the logic operating unit 142 may have a 1/n data signal input period.

The second delay unit 143 may receive the output signal of the logic operating unit 142, and may delay the received signal. The second delay unit 143 may output a signal to the impedance matcher 120. The output of the second delay unit 143 may be used as the control signal TE.

In a double data rate 2 (DDR2) and a double data rate 3 (DDR3) memory, an input period of a data signal may be equal to a half of a period of the system clock. In this example, the system clock may be used for the clock signal CLK input to the control signal generator 140.

Figure 3:
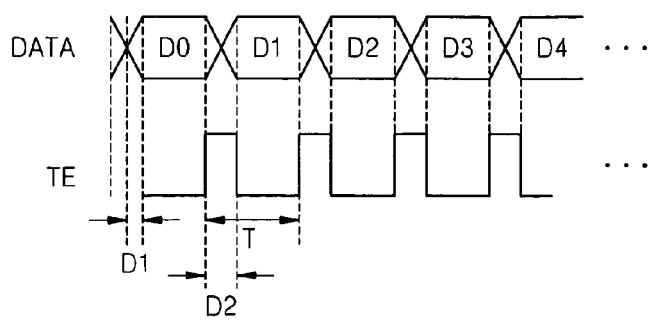
FIG. 3 is a timing diagram illustrating a waveform of a control signal output from a control signal generator, according to an example embodiment.

FIG. 3 is a timing diagram illustrating a waveform of a control signal output from the control signal generator 140 of FIG. 2. Referring to FIG. 3, an input data signal DATA has a period equal to the half period of the clock signal CLK.

The logic operating unit 142 may perform a logic operation between the clock signal CLK and the output signal of the first delay unit 141 to output a signal having a 1/n period of the data signal DATA. For example, referring to FIG. 3, the period T of the output signal of the logic operating unit 142 may be the same or substantially the same as the input period of the data signal DATA.

In order to create the aforementioned output signal of the logic operating unit 142, the logic operating unit 142 may perform a logic operation, such as, an exclusive-OR operation or an exclusive-NOR operation between the clock signal CLK and the output signal of the first delay unit 141. Within one period T of the output signal of the logic operating unit 142, the duty rate may be determined by amount of delay provided by the first delay unit 141. For example, the duration of D2, in which the control signal TE enables the impedance matching unit 120, may be controlled by controlling the delay amount of the first delay unit 141.

The second delay unit 143 may receive a signal output from the logic operating unit 142, and may output the signal with a delay D1. By controlling the delay D1, the control signal TE may enable the impedance matcher 120 when a data signal DATA level transition occurs. In FIG. 3, D2 that enables the impedance matcher 120 may be matched (e.g., precisely) with the portion in which the data signal DATA level transition occurs. However, example embodiments are not limited thereto, and D2 may include a portion where the data signal DATA level transition occurs, by controlling the delay amount of the first delay unit 141.

The first delay unit 141 may delay the clock signal CLK by about half of the input period of the data signal DATA. In this example, the width of higher level may be the same or substantially the same as the width of the lower level within one period of the control signal TE. In addition, a higher level or lower level portion for enabling the impedance matcher 120 may correspond to the section where the data signal DATA level transit occurs.

Figure 4:
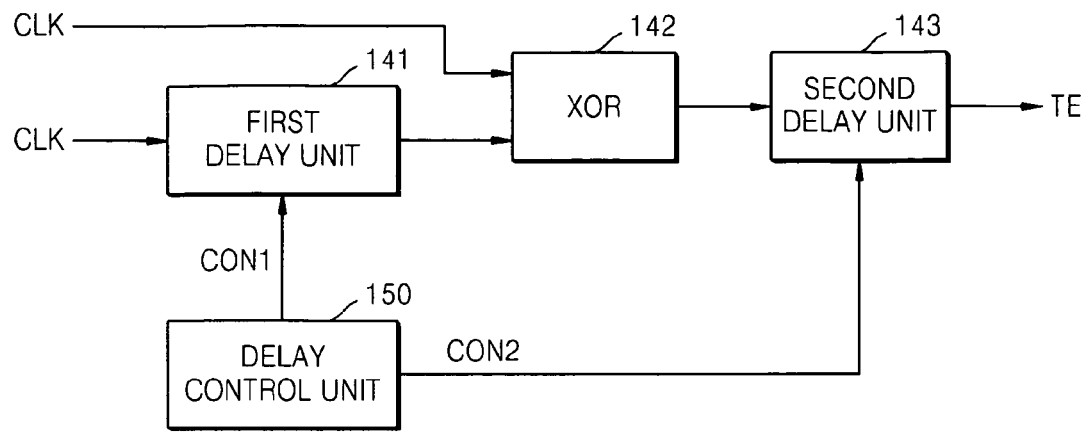
FIG. 4 is a block diagram illustrating a signal delay control performed by a control signal generator, according to an example embodiment.

FIG. 4 is a block diagram illustrating a signal delay control performed by the control signal generator of FIG. 2. Referring to FIG. 4, the control signal generator may include the first delay unit 141 for controlling a duty rate of the control signal TE and the second delay unit 143 for allowing a section, where a termination circuit is enabled, to correspond to a section where a data signal level transition occurs. For example, in FIG. 4, the logic operating unit may include, for example, an exclusive-OR gate 142.

The delay amount of the first delay unit 141 and the second delay unit 143 may be determined in a variety of ways. For example, the first delay unit 141 may include a plurality of inverter chains, each having a different delay. Similarly, the second delay unit 143 may include a plurality of inverter chains having a different delay. In an example test mode, a data signal may be sent/received to/from an external controller by changing the delay amount of the delay units 141 and 143, respectively, so that the delay of the first delay unit 141 and the second delay unit 143 may be determined from a signal delay having a reduced (e.g., minimum) noise according to data signal input/output characteristics.

When the delay amount of the first delay unit 141 and the second delay unit 143 are controlled according to a test result of data signal input/output characteristics, as shown in FIG. 4, the termination circuit may further include a delay control unit 150. The delay control unit 150 may output a first delay control signal CON1 to the first delay unit 141 and a second delay control signal CON2 to the second delay unit 143.

The delay control unit 150 may be implemented in any suitable manner so long as the aforementioned operation may be performed. For example, the delay control unit 150 may include a mode register set (MRS). The MRS may program and store control data for controlling various operation modes of the memory device. In this example, the delay control signals CON1 and CON2 may be control data from the MRS.

In another example, the delay control unit 150 may include a fuse. In this example, the delays of the first delay unit 141 and the second delay unit 143 may be controlled according to whether one or more fuses included in the fuse are cut.

Figure 5:
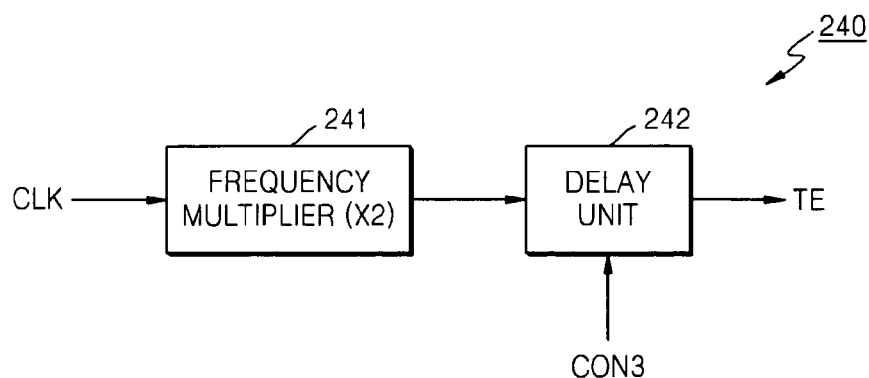
FIG. 5 is a block diagram of a control signal generator included in a termination circuit, according to another example embodiment.

FIG. 5 is a block diagram of a control signal generator included in a termination circuit, according to another example embodiment. Referring to FIG. 5, a control signal generator 240 may include a frequency multiplier 241 and a delay unit 242. The frequency multiplier 240 may receive a clock signal CLK and output a signal having a frequency n times of that of the clock signal CLK. The delay unit 242 may receive a signal output from the frequency multiplier 241 and output a delayed signal. The signal output from the delay unit 242 may be a control signal TE and be output to the impedance matcher 120 of FIG. 2.

In this example, the aforementioned system clock may be used as the clock signal CLK. The frequency multiplier 241 may output a signal having a frequency two times the frequency of the clock signal CLK. The delay unit 242 may delay a signal so that a portion in which the control signal TE enables the impedance matcher 120 corresponds to a portion in which the data signal level transition occurs. As described above, the delay of the delay unit 242 may be controlled according to the test result of data signal input/output characteristics. In this example, a delay control signal CON3 may be provided to the delay unit 242.

Figure 6A:
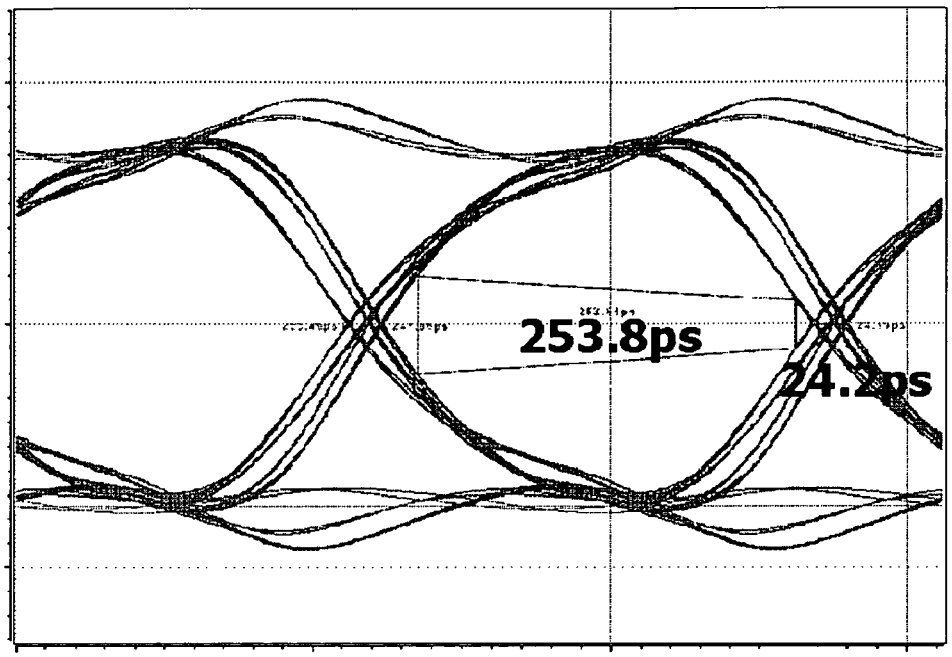
FIGS. 6A and B are diagrams illustrating a data signal input to a semiconductor memory device, according to an example embodiment relative to the related art.
Figure 6B:
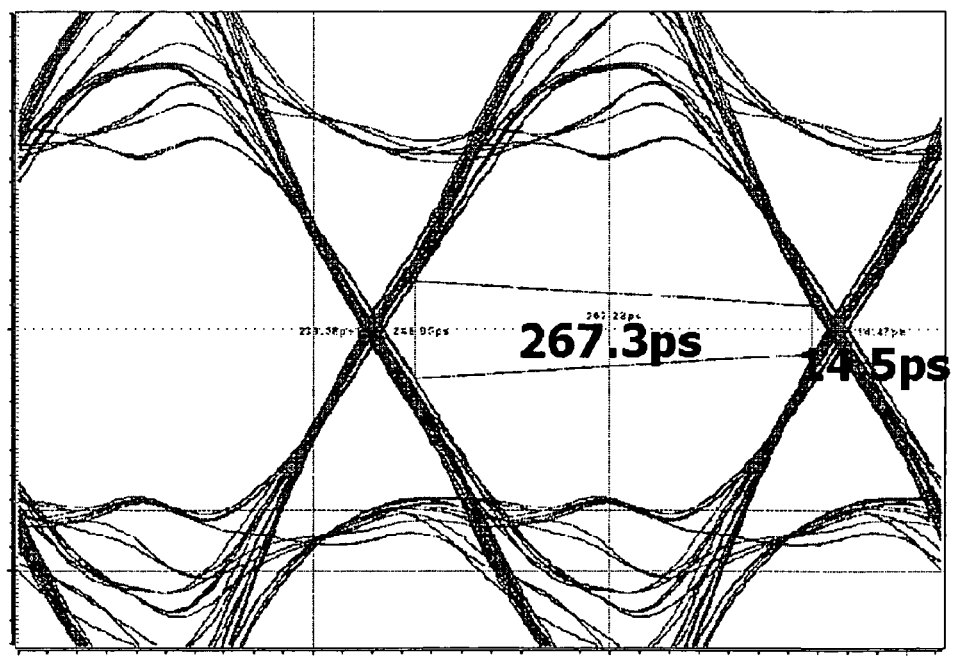

FIGS. 6A and 6B are diagrams illustrating a data signal input to a related art semiconductor memory device and a semiconductor memory device according to an example embodiment, respectively. When a data signal is input and a current path is formed due to a connection between a termination resistor and an input buffer, the termination resistor functions as a load. According to an example embodiment and as shown in FIG. 6B, the load caused by the termination resistor may be removed in at least some parts of an input portion of the data signal to improve a slew rate.

Figure 7:
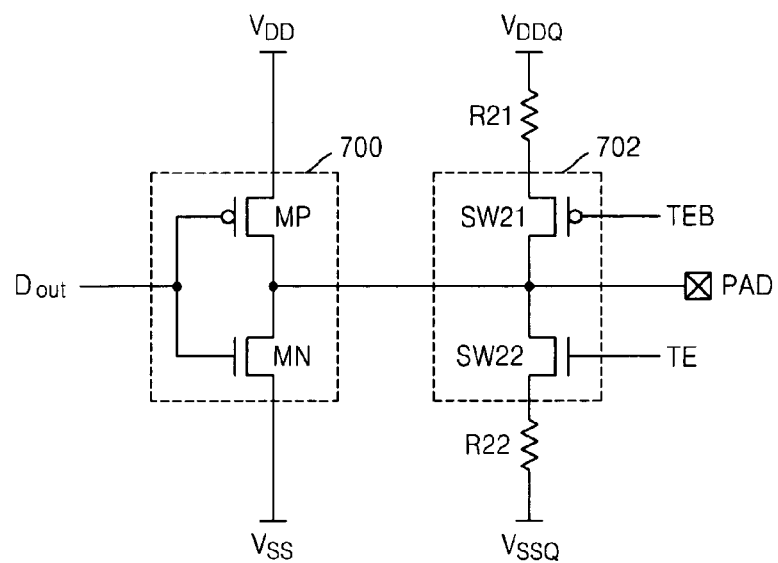
FIG. 7 is a circuit diagram illustrating a termination circuit included in a semiconductor memory device, according to another example embodiment.

FIG. 7 is a circuit diagram illustrating a semiconductor memory device, according to another example embodiment. Referring to FIG. 7, the semiconductor memory device may include an output buffer 700. The output buffer 700 may include a PMOS transistor MP of which one electrode may be connected to a power voltage VDD and an NMOS transistor MN of which one electrode may be connected to a ground voltage VSS. The PMOS transistor MP and the NMOS transistor MN may be controlled by a data output signal Dout.

When data is transmitted to an external circuit through a pad PAD, the termination circuit 702 may be connected to the output buffer 700. The termination circuit 702 may include at least one termination resistor and at least one switch. In at least one example embodiment, the termination circuit 702 may include a plurality of resistors and/or a plurality of switches. For example, the termination circuit 702 may include a first resistor R21, of which one end is connected to a power voltage VDDQ, and a second resistor R22, of which one end is connected to a ground voltage VSSQ. The termination circuit 702 may further include a first switch SW21, which controls a connection between the first resistor R21 and the output buffer 700, and a second switch SW22, which controls a connection between the second resistor R22 and the output buffer 700.

The termination circuit 702 may further include a control signal generator (not shown), which generates a control signal TE for controlling on/off of the first switch SW21 and the second switch SW22.

The control signal generator may have a structure similar or substantially similar to that of the control signal generator of FIG. 2, and thus, a detailed description thereof has been omitted for the sake of brevity.

When the semiconductor memory device of FIG. 7 operates as a receiver, information connected by an input data signal may not be acquired. Consequently, switches that control enable/disable of the termination circuit 702 may need to be turned on/off periodically. In another example, when the semiconductor memory device of FIG. 7 operates as a driver, information on an output data signal may be acquired, and thus, the switches may turn on/off in a section where a data signal level transition occurs in practice.

Figure 8:
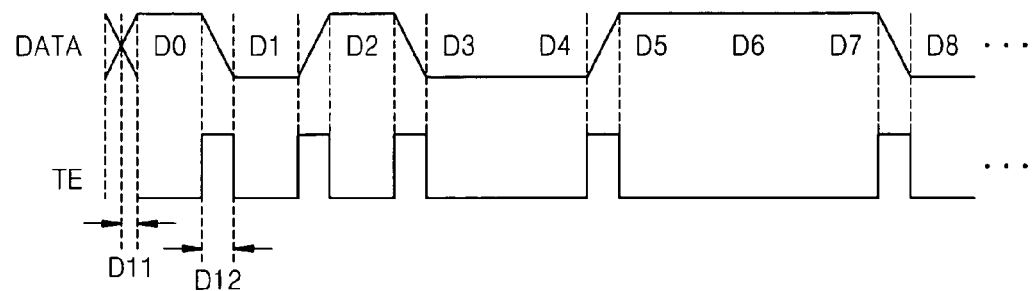
FIG. 8 is a timing diagram illustrating a waveform of a control signal input to the switches of FIG. 7.

FIG. 8 is a timing diagram illustrating a waveform of a control signal input to the switches of FIG. 7. A control signal TE of FIG. 8 is a clock signal input to the control signal generator 140 of FIG. 2, and may be obtained using the data output signal Dout. A higher level section D12 of the control signal TE may be controlled according to a delay of a first delay unit. A delay D11 may allow a section, where termination circuit 702 is enabled, to correspond to a section where the data signal level transition occurs in practice, and may be controlled by a second delay unit.

As shown in FIG. 8, the termination circuit connected to the output buffer may be enabled according to a section where a data output signal Dout level transition occurs in practice, resulting in reduced power consumption and/or improved data output characteristics.

Accordingly, according to at least some example embodiments, an enable/disable of a termination circuit may be periodically controlled when a data signal is input, so that power consumption may be reduced and/or input/output characteristics of a data signal may be improved.

While example embodiments have been particularly shown and described with reference to the example embodiments shown in the drawings, it will be understood by those skilled in the art that various changes in form and details may be made therein without departing from the spirit and scope of the present invention as defined by the appended claims.

What is claimed is:

1. A termination circuit comprising:
   at least one termination resistor connected to a buffer for impedance matching;
   at least one switch, each of the at least one switches being directly connected between the buffer and a corresponding one of the at least one termination resistors, each of the at least one switches controlling a connection between the buffer and the corresponding one of the at least one termination resistors; and
   a control signal generator configured to generate a control signal for selectively enabling the termination circuit by controlling each of the at least one switches, the control signal having a period less than or equal to an input period of a data signal.

2. The termination circuit of claim 1, wherein a time period during which the control signal enables the termination circuit corresponds to a time period in which a data signal level transition occurs.

3. The termination circuit of claim 1, wherein the control signal has a period that is the same as the input period of the data signal.

4. A termination circuit comprising:
   at least one termination resistor connected to a buffer for impedance matching;
   at least one switch, each of the at least one switches being connected between the buffer and a corresponding one of the at least one termination resistors, each of the at least one switches controlling a connection between the buffer and the corresponding one of the at least one termination resistors; and
   a control signal generator configured to generate a control signal for selectively enabling the termination circuit by controlling each of the at least one switches, the control signal having a period less than or equal to an input period of a data signal. wherein the control signal generator includes,
      a first delay unit configured to receive a clock signal and output a delayed clock signal, and
      a logic unit configured to perform a logic operation on the clock signal and the delayed clock signal to output a signal having a period less than or equal to the input period of the data signal.

5. The termination circuit of claim 4, wherein the period of the signal output from the logic unit is equal to 1/n of the input period of the data signal, where n is an integer.

6. The termination circuit of claim 4, wherein the control signal generator further includes, a second delay unit configured to receive the signal output from the logic unit and output a delayed signal as the control signal.

7. The termination circuit of claim 6, wherein a delay amount of the first delay unit and the second delay unit is determined based on data signal input/output characteristics.

8. The termination circuit of claim 7, wherein the data signal input/output characteristics are determined based on test results associated with an external controller.

9. The termination circuit of claim 6, wherein the first delay unit delays the clock signal by half the input period of the data signal, and the logic unit performs an exclusive-OR operation on the clock signal and the output signal from the first delay unit.

10. A termination circuit comprising:
at least one termination resistor connected to a buffer for impedance matching:
at least one switch, each of the at least one switches being connected between the buffer and a corresponding one of the at least one termination resistors, each of the at least one switches controlling a connection between the buffer and the corresponding one of the at least one termination resistors; and
a control signal generator configured to generate a control signal for selectively enabling the termination circuit by controlling each of the at least one switches, the control signal having a period less than or equal to an input period of a data signal, wherein the control signal generator includes,
a frequency multiplier configured to receive a clock signal and output a signal having a frequency n times the clock signal, where n is an integer, and
a delay unit configured to receive the signal output from the frequency multiplier and output a delayed signal as the control signal.

11. The termination circuit of claim 10, wherein a delay amount of the delay unit is controlled according to data signal input/output characteristics.

12. The termination circuit of claim 11, wherein the data signal input/output characteristics are determined based on test results associated with an external controller.

13. The termination circuit of claim 10, wherein the frequency multiplier receives the clock signal and outputs a signal having a frequency twice a frequency of the clock signal.

14. A semiconductor memory device comprising:
a buffer configured to at least one of receive or output a data signal; and
the termination circuit of claim 1.

15. A semiconductor memory device comprising:
a buffer configured to at least one of receive or output a data signal; and
a termination circuit including,
at least one termination resistor connected to a buffer for impedance matching,
at least one switch, each of the at least one switches being connected between the buffer and a corresponding one of the at least one termination resistors, each of the at least one switches controlling a connection between the buffer and the corresponding one of the at least one termination resistors, and
a control signal generator configured to generate a control signal for selectively enabling the termination circuit by controlling each of the at least one switches, the control signal having a period less than or equal to an input period of a data signal, wherein the control signal generator includes,
a first delay unit configured to receive a clock signal and output a delayed clock signal, and
a logic unit configured to perform a logic operation on the clock signal and the delayed clock signal to output a signal having a period less than or equal to the input period of the data signal.

16. The semiconductor memory device of claim 15, wherein the control signal generator further includes,
a second delay unit configured to receive the signal output from the logic unit and output a delayed signal as the control signal.

17. The semiconductor memory device of claim 16, wherein a delay amount of the first delay unit and the second delay unit are determined based on data signal input/output characteristics.

18. The semiconductor memory device of claim 15, wherein the first delay unit delays the clock signal by half an input period of the data signal, and the logic unit performs an exclusive-OR operation on the clock signal and the output signal of the first delay unit.

19. A semiconductor memory device comprising:
a buffer configured to at least one of receive or output a data signal; and
a termination circuit including,
at least one termination resistor connected to a buffer for impedance matching,
at least one switch, each of the at least one switches being connected between the buffer and a corresponding one of the at least one termination resistors, each of the at least one switches controlling a connection between the buffer and the corresponding one of the at least one termination resistors, and
a control signal generator configured to generate a control signal for selectively enabling the termination circuit by controlling each of the at least one switches, the control signal having a period less than or equal to an input period of a data signal, wherein the control signal generator includes,
a frequency multiplier configured to receive a clock signal and output a signal having a frequency n times the clock signal, where n is an integer, and
a delay unit configured to receive the signal output from the frequency multiplier and output a delayed signal as the control signal.

20. The semiconductor memory device of claim 19, wherein a delay amount of the first delay unit and the second delay unit is determined based on data signal input/output characteristics.

21. The semiconductor memory device of claim 14, wherein the termination circuit is enabled according to a time period during which a level transition of the data signal occurs.

22. The semiconductor memory device of claim 14, wherein the at least one switch is controlled such that the termination circuit is enabled while the data signal is output.

* * * * *